(12) United States Patent
Sieben

(10) Patent No.: US 6,275,329 B1
(45) Date of Patent: Aug. 14, 2001

(54) METHOD AND APPARATUS FOR AMPLIFICATION OF AN OPTICAL SIGNAL

(75) Inventor: Michael Sieben, Sunnyvale, CA (US)

(73) Assignee: ONI Systems Corp., San Jose, CA (US)

( * ) Notice: Subject to any disclaimer, the term of this patent is extended or adjusted under 35 U.S.C. 154(b) by 0 days.

(21) Appl. No.: 09/307,666

(22) Filed: May 10, 1999

(51) Int. Cl.[7] .................................................. H01S 3/00
(52) U.S. Cl. ..................... 359/337.15; 359/177
(58) Field of Search .................. 359/341, 177, 359/337, 337.13

(56) References Cited

U.S. PATENT DOCUMENTS

| | | |
|---|---|---|
| 5,812,710 | 9/1998 | Sugaya . |
| 5,923,450 * | 7/1999 | Dugan et al. .................... 359/127 |
| 6,031,647 * | 2/2000 | Roberts ........................... 359/161 |
| 6,031,659 * | 2/2000 | Okiyama ......................... 359/341 |
| 6,108,123 * | 8/2000 | Kinoshita ........................ 359/337 |

OTHER PUBLICATIONS

Wysocki, Paul F., et al., "Erbium–Doped Fiber Amplifier Flattened Beyond 40 nm Using Long–Period Grating" Optical Fiber Communication Conference, Optical Society of America, Washington D.C., paper PD2, pp. 1–4 (1997).

Mori, Atsushi, et al., "1.5μm Broadband Amplification By Tellurite–Based EDFAs" Optical Fiber Communication Conference, Optical Society of America, Washington D.C., paper PD1, pp. 1–4 (1997).

Takachio, N., et al., "WDM Linear Repeater Gain control Scheme By Automatic Maxiumum Power Channel Selection for Photonic Transport Network" Optical Fiber Communication Conference, Optical Society of America, Washington D.C., paper WJ4, pp. 165–166 (1998).

Kim, Hyo Sang, et al., "Dynamic Gain Equalization of Erbium–Doped Fiber Amplifier with All–Fiber Acousto–Optic Tunable Filters" Optical Fiber Communication Conference, Optical Society of America, Washington D.C., paper WG4, pp. 136–138 (1998).

Fukushima, H., et al., "Non–Mechanical Variable Attenuator Module Using Faraday Effect" OSA TOPS on Optical Amplifiers and Their Applications, Optical Society of America, Washington D.C., vol. 5, pp. 249–252 (1996).

Srivastava, A.K., et al., "Fast Gain Control in an Erbium–Doped Amplifier" OSA Trends in Optics and Photonics Series, Optical Society of America, Washington D.C., paper PDP4, vol. 5, pp. 24–27 (1996).

* cited by examiner

Primary Examiner—Mark Hellner
(74) Attorney, Agent, or Firm—Townsend and Townsend and Crew LLP

(57) ABSTRACT

A method and apparatus for amplifying an optical signal in an optical network is provided. In an embodiment of the present invention, an optical amplifying module is disclosed for use in an optical network. The optical amplifying module comprises a variable optical attenuator (VOA), an optical amplifier and a controller. The VOA, optical amplifier and controller are coupled to each other and the optical network. The VOA attenuates the optical input signal to produce an attenuated output signal. The optical amplifier amplifies the attenuated output signal to produce an amplified output signal. The controller receives network operating parameters and also monitors the power levels of the attenuated and amplified signals. Based on the measured power levels and the received operating parameters, the controller adjusts the VOA such that the optical output power per channel is maintained at a constant value. The overall gain flatness of the entire system is maintained over a wide range of input powers and a wide range of number of channels in a multi-wavelength system.

35 Claims, 15 Drawing Sheets

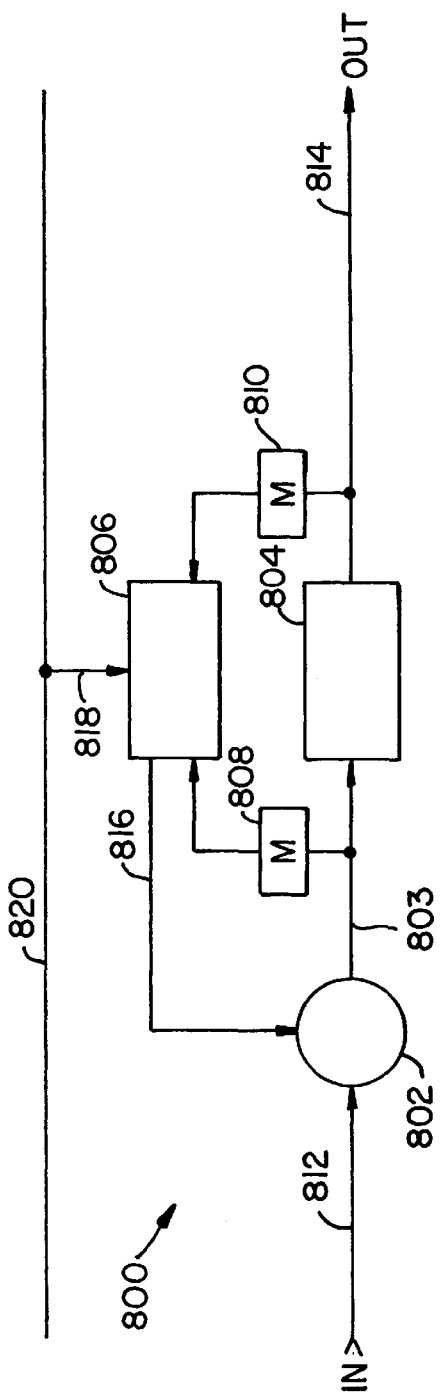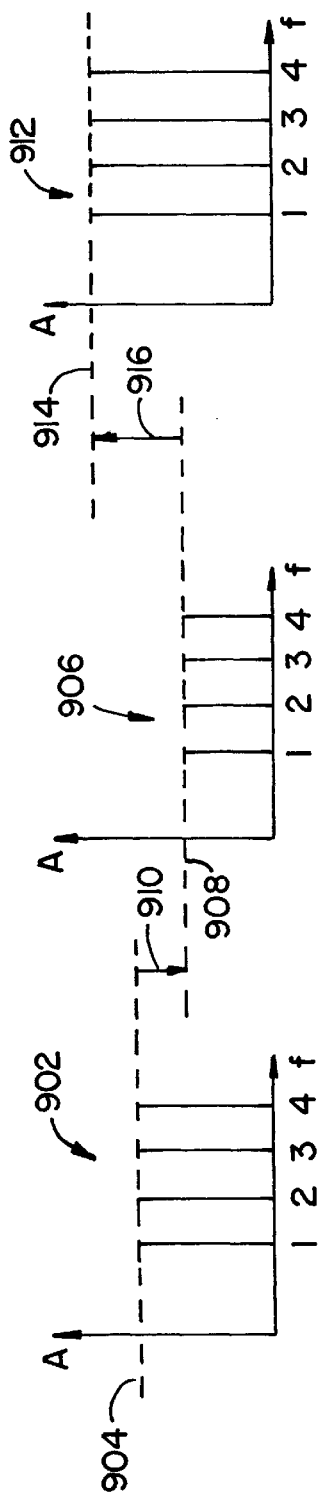
FIG. 8.
FIG. 9.

METHOD AND APPARATUS FOR AMPLIFICATION OF AN OPTICAL SIGNAL

FIELD OF THE INVENTION

The present invention relates generally to optical systems, and more particularly, to a method and apparatus for amplifying an optical signal in an optical network.

BACKGROUND OF THE INVENTION

Optical amplifiers, specifically Erbium Doped Fiber Amplifiers (EDFA), have introduced a new generation in optical transport systems. EDFAs have allowed the transmission of optical signals over thousands of kilometers without electrical regeneration. The next generation of optical systems is expected to comprise all-optical networks wherein optical signals are routed and switched through the network while remaining in optical form. The path loss of such an optical signal can become large enough to necessitate the use of EDFAs to amplify the signal at various points along the path of travel. Standard EDFAs have been successful in static point to point links where the optical path does not change; however, problems can arise in an all-optical network when the path length and/or path loss changes dynamically.

The natural gain profile of an EDFA is generally nonuniform over the traditional wavelength range of 1530 to 1565 nanometers (nm). In addition, the nonuniformity of the gain profile changes as the input power to the EDFA changes. This effect is commonly called dynamic gain tilt. Since previous optical systems typically utilized static point to point links having constant optical signal power, gain-flattening techniques could be used to compensate for the nonuniform gain profile of an EDFA. When designed for a specific input power and gain profile, these techniques can be used to flatten the gain of an EDFA allowing the full gain window to be utilized in an optical network.

Optical networks that are configured as multichannel or wavelength division multiplexed (WDM) systems benefit from using the full gain window of an optical amplifier. A WDM network divides the available spectrum into channels comprising one or more usable wavelengths, thus allowing multiple signals to be simultaneously transmitted on the same fiber. In WDM systems, it is important to have uniform gain for all channels to limit nonuniform bit error rates (BER) across the channels. In a typical WDM network, gain flatness is in the range of ±0.75 dB over the available spectrum. Excess dynamic gain tilt can cause significant BERs on low gain channels in a cascade of optical amplifiers.

In order to increase the channel count in a WDM system and still maintain a flat gain profile, techniques for flattening the gain of an EDFA have been developed. One technique is to filter the optical signal as disclosed in, Erbium-doped fiber amplifier flattened beyond 40 nm using long-period grating, authored by P. F. Wysocki, J. Judkins, R. Espindola, M. Andrejco, A Vengsarkar and K. Walker and published in *Optical Fiber Communication Conference*, Optical Society of America, Washington, D.C., paper PD2, 1997. Gain flattening may also be accomplished by changing the doping profile within the fiber so that the natural gain shape is flatter as disclosed in, 1.5 um broadband amplification by tellurite-based EDFAs, authored by A. Mori, Y. Ohishi, M. Yamada, H. Ono, Y. Nishida, K. Oikawa, and S. Sudo and published in *Optical Fiber Communication Conference*, Optical Society of America, Washington, D.C., paper PD1, 1997. Unfortunately, these techniques are generally only applicable to cases where the input power to the EDFA is constant or can change by only a small amount. When the input power to the EDFA changes by a large amount, dynamic gain tilt can still become a problem.

Recently, techniques have been investigated where the dynamic range of the EDFA is expanded with the operating gain and gain flatness being maintained. One of these techniques involves using a loop controller to lock the gain of the EDFA as disclosed in *Optical Amplifiers and their Applications*, authored by A. K. Sravistava, et al., and published in Vol. V of OSA Trends in Optics and Photonics Series, Optical Society of America, Washington, D.C., paper PDP4, 1996. In this approach, the input and output optical power of the EDFA are sampled and control signals to the EDFA are adjusted to keep the ratio of the input power to output power constant. Another technique involves using an acousto-optic tunable filter at the midstage point of an EDFA as disclosed in, Dynamic gain equalization of erbium-doped fiber amplifier with all-fiber acousto-optic tunable filters, authored by H. S. Kim, S. H. Yun, H. K. Kim, N. Park, B. and Y. Kim, and published in *Optical Fiber Communication Conference*, Optical Society of America, Washington, D.C., paper WG4, 1998. In this approach, the filter shape is tailored to maximize the gain flatness for a given input power and gain shape. Still another technique involves using a variable optical attenuator (VOA) between two successive gain stages as disclosed in, WDM linear repeater gain control scheme by automatic maximum power channel selection for photonic transport network, authored by N. Takachio, H. Suzuki, M. Koga, and O. Ishida, and published in *Optical Fiber Communication Conference*, Optical Society of America, Washington, D.C., paper WJ4, 1998. The disclosed technique improves the dynamic range capability slightly but has only been demonstrated over a narrow wavelength range of 1540 to 1560 nm and does not use any external network information in determining the ideal operating conditions for the module.

The above techniques help to solve the problem of maintaining the gain flatness by gain locking the amplifier, however utilizing the above techniques, changes in the total output power of the EDFA will still occur as the input power changes. The ideal case for a dynamic network is to have a constant output power per channel at the output of each optical amplifier for a wide range of input powers and varying numbers of channels. Gain locking techniques on their own maintain the gain flatness of the amplifier but can only do this over a limited input range and by design, do not maintain constant output power. A constant output power can limit nonlinear effects in the fiber in excessive output power cases and prevents downstream components from experiencing large changes in received optical power. As a result, changes in power levels can be localized in the network.

This presents a problem in all-optical networks since the optical power input to an EDFA will vary dramatically due primarily to two effects. The first effect is the change brought about by a switching event required for restoring traffic in the network. Optical signals originate at different sources and travel different paths to get to the EDFA. In an all-optical network, the light launched into one fiber may be re-routed to another fiber if the first fiber's connection is broken. In the worst case, the two paths will have extremely different loss characteristics that will result in a large variation of input power to the receiving EDFA. The second effect results from changes in network configuration, such as, changing the total number of channels in a WDM network's configuration. When the individual power per channel is constant, changing the number of channels in a WDM system changes the total power in the fiber. EDFAs experience saturation effects based on the total optical power in the fiber. Thus, changes in fiber loss and network configuration can lead to dynamic changes to the input power at an EDFA resulting in signal degradation due to gain tilt.

Therefore, what is needed is a way to amplify an optical signal in an optical network wherein the optical output power per channel remains constant regardless of the dynamic variations of the input signal power which may result from fiber loss and/or network reconfigurations. This will maintain channel integrity over the full range of network re-configurations.

SUMMARY OF THE INVENTION

The present invention provides a method and apparatus by which the output power per channel from an optical amplifying module will remain constant for a wide range of input optical powers. The present invention allows an optical network to reconfigure itself in terms of routing paths and the number of channels per fiber without degradation of individual channel BERs.

In an embodiment of the present invention an optical amplifying module is disclosed for use in an optical network. The optical amplifying module comprises a variable optical attenuator (VOA), an optical amplifier and a controller. The VOA, optical amplifier and controller are coupled to each other and the optical network. The VOA attenuates the optical input signal to produce an attenuated output signal. The optical amplifier amplifies the attenuated output signal to produce an amplified output signal. The controller receives network operating parameters and also monitors the power levels of the attenuated and amplified signals. Based on the measured power levels and the received operating parameters, the controller adjusts the VOA such that there is a signal of constant power input to the optical amplifier thereby producing output signals having constant optical power per channel.

A further understanding of the nature and advantages of the present invention may be realized by reference to the remaining portions of the specification and the drawings.

BRIEF DESCRIPTION OF THE DRAWINGS

FIG. 8 illustrates another embodiment of the present invention;

FIG. 9 illustrates waveforms associated with the embodiment of FIG. 8;

DESCRIPTION OF THE SPECIFIC EMBODIMENTS

Figure 1:
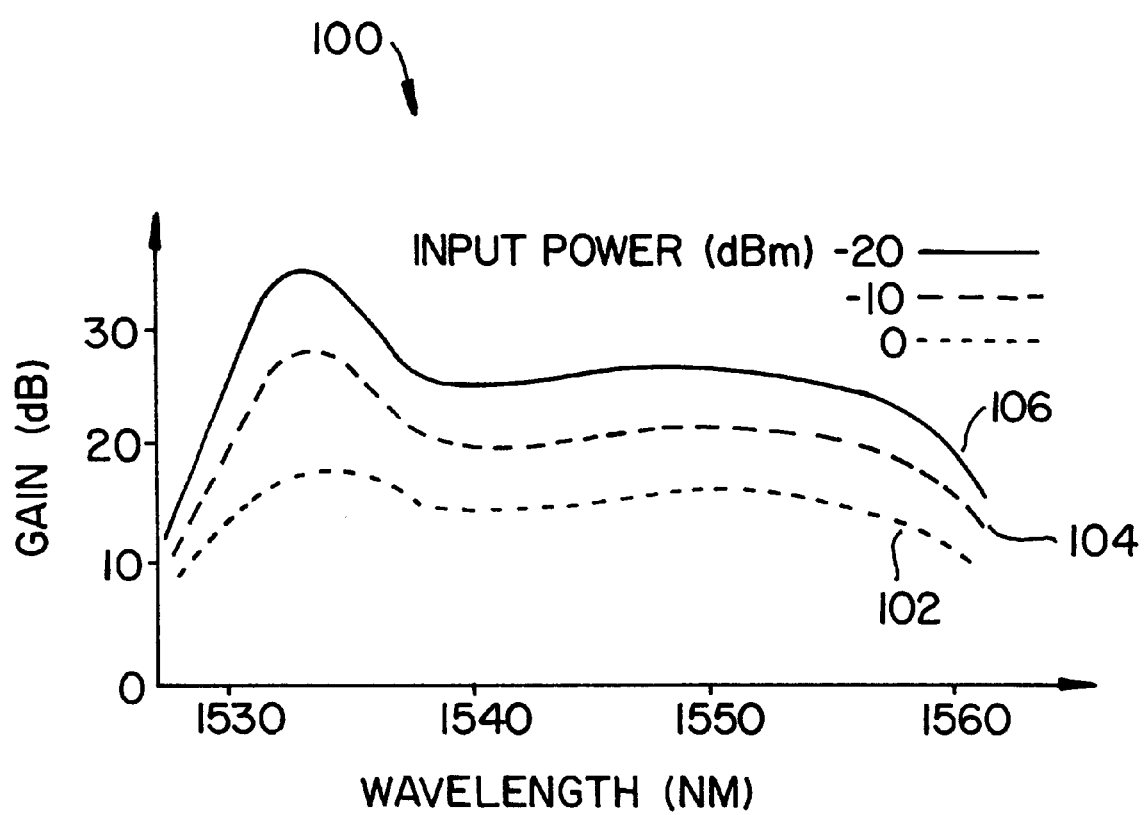
FIG. 1 illustrates a graph representative of the effects of dynamic gain tilt in a typical section of erbium fiber.

FIG. 1 illustrates a gain plot 100 depicting changes in the gain profile of a typical section of erbium fiber as the power of the optical input signal varies. In a typical EDFA, with a constant pump current, the gain profile may change based on power variations of the optical input signal. Curves 102, 104 and 106 depict the gain profiles that result from optical input powers having increasing values respectively. It can be seen from gain plot 100 that as the input power to the EDFA changes, the gain and the gain flatness change.

Figure 2:
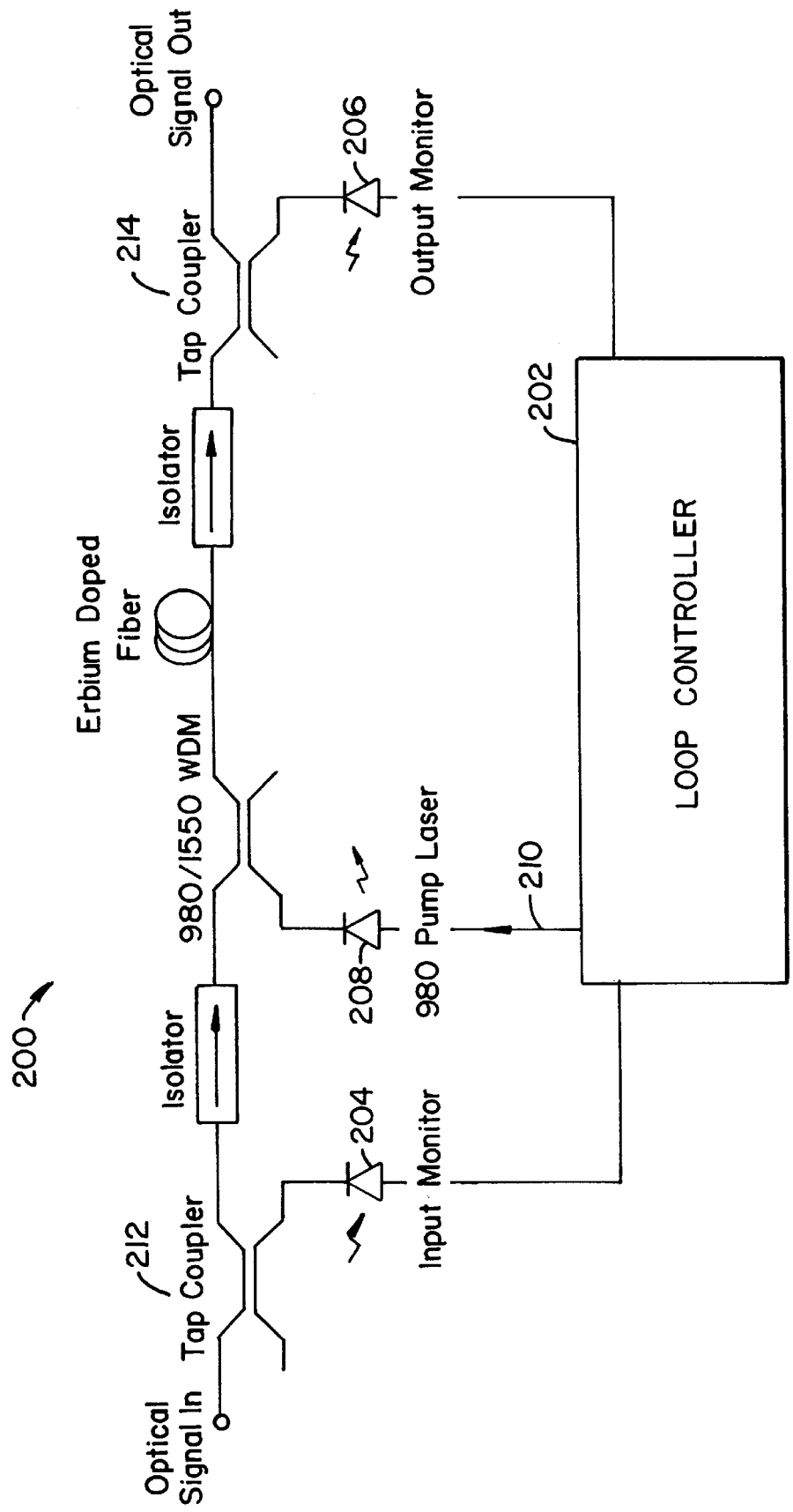
FIG. 2 illustrates a detailed view of a typical single pumped EDFA amplifier.

FIG. 2 depicts the layout of a typical optical amplifier 200. Optical amplifier 200 comprises a single pumped gain locked EDFA. A loop controller 202 locks the gain of the amplifier by monitoring the input optical power via the input monitor 204 and the output optical power via the output monitor 206. An optical monitor, such as monitor 204 or 206, can consist of a detector such as a PIN photodiode. The monitors use tap couplers 212 and 214 to tap a percentage of the mainstream light to determine the total input and output optical powers. Loop controller 202 regulates a pump laser 208 via a pump drive current 210 thereby setting an amplification factor such that the overall gain of the amplifier is constant. Additional adjustments to the pump laser 208 accommodate for amplified spontaneous emission (ASE) noise at the output of the amplifier. This insures that the gain flatness for a specific gain profile is maintained for a range of input power levels. The typical optical amplifier 200 is shown as a single pumped Erbium type but is not restricted to this type. For example, the optical amplifier could be a doubled pumped Erbium fiber amplifier or an amplifier wherein other types of rare earth doped fibers are used. The general function of the optical amplifier 200 is to provide a locked gain for a given input optical signal.

Figure 3:
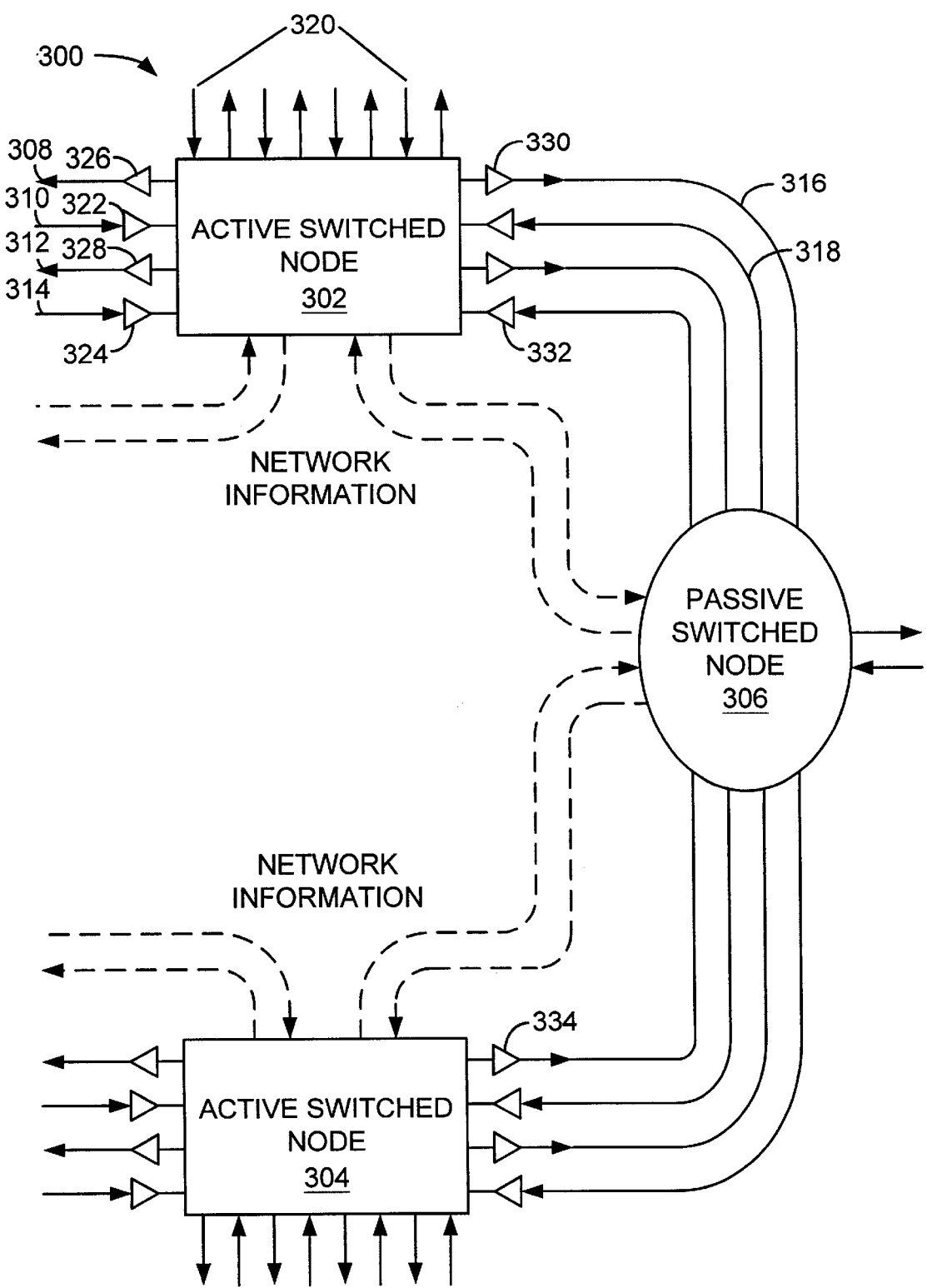
FIG. 3 illustrates an optical network configuration.

FIG. 3 depicts optical network 300 comprising Active Switched Node 302, Active Switched Node 304 and Passive Switched Node 306. Node 302 and node 304 are nodes in which in-going and out-going fibers use EDFAs, while node 306 is implemented without EDFAs. Problems occur in the network when optical input power varies due to changes in signal path or changes in the number of channels used in an optical signal. In FIG. 3, fiber 308 and fiber 310 represent a bi-directional working and protected optical pair wherein optical information is transmitted and received. There are other working and protected pairs throughout the network such as fiber 312 together with fiber 314 and fiber 316 together with fiber 318. Node 302 has the capability to route traffic from the fiber pairs up to access fibers 320. Any of the depicted nodes has the capability to switch the optical traffic such that a signal on any available input fiber could be routed to any available output fiber. The specific switching architecture is not relevant to the present invention and will not be discussed in detail. However, an important result of the node's switching capability is the fact that light from any input fiber may be dropped at the node or switched to an output fiber wherein the optical signal may experience changes in signal power.

In a WDM system, where optical signals occupy channels comprising portions of the available wavelength spectrum, signal losses may occur due to a variety of reasons. Both receiving EDFAs, known as preamps, such as those shown at 322 and 324, and transmitting EDFAs, known as postamps, such as those shown at 326 and 328, are generally required to overcome a variety of losses. The transmitting EDFAs must overcome loses due to, for example, switches, multiplexers and connectors located within the nodes. The receiving EDFAs must overcome internodal loss consisting mainly of fiber loss but also including losses from other passive components.

Operation of an optical network having dynamic WDM capability could result in a number of situations where excessive changes in signal power result in unacceptable BERs. Switching events within the active node can cause the optical power input to a transmitting EDFA to vary dramatically. The difference is a direct result of the optical path loss varying due to a change in the number and/or type of passive components the light passes through. Receiving EDFAs also suffer similar events resulting with input power variations. For example, a switching event in a node could direct an optical signal back onto a receive EDFA before it has encountered a significant loss. Consider the case where node 306 is close to node 302 but far from node 304. If a failure occurred in the network somewhere between node 306 and node 304, node 306 could redirect light transmitted from a transmit EDFA, such as 330, back to a receive EDFA, such as 332, with very little attenuation. However, signals received at EDFA 332 which were transmitted from EDFA 334 would generally have a lower power level due to the long transmission path. Thus, there could be a wide range of signal powers a receive EDFA could see as a result of signals being switched throughout the network.

The second mode of varying input signal power to an EDFA occurs when there is a change to the total number of channels used in the input signal. Operation of the network could result in changing the total number of channels an EDFA amplifies if individual channels are actively added to or dropped from a fiber. This addition and subtraction of channels could be a result of signal restoration or simply changes to accommodate usage of the network. Changes in the number of channels used can result in substantial changes in overall signal power. For example, if the individual channel power is 1 mW, the difference in power between an optical signal that has a single channel to one that has 32 channels is 15 dB. Currently, typical EDFAs cannot remain gain locked for a large dynamic range of input powers. Further, the gain flatness cannot be maintained with a constant output power if the input power significantly varies.

Figure 4:
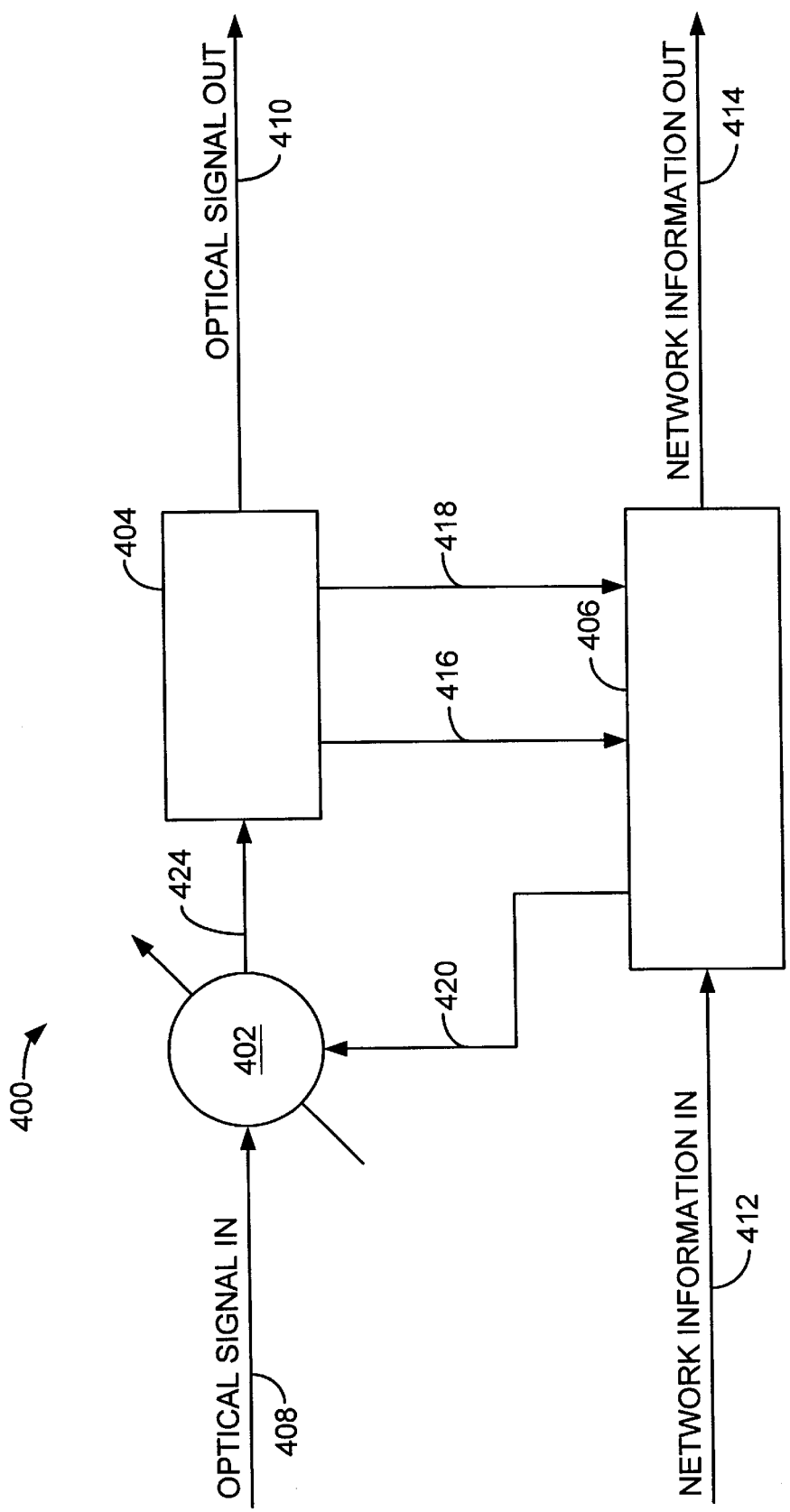
FIG. 4 illustrates an embodiment of the present invention.

FIG. 4 depicts an embodiment of an optical amplifying module 400 constructed according to the teachings of the present invention. The optical amplifying module 400 comprises a variable optical attenuator (VOA) 402, a gain locked optical amplifier 404 and a controller 406. The VOA 402 has an optical input 408 for receiving optical signals from the optical network and is further coupled to the optical amplifier 404 and the controller 406. The optical amplifier 404 has an optical output 410 for outputting optical signals to the optical network and it is also coupled to the controller 406. The controller 406 is coupled to the optical network and has a network parameter input 412 and a network parameter output 414.

Optical networks may comprise a data network and a control network. The data network may comprise high bandwidth data signals while the control network may comprise lower bandwidth control signals. The data and control networks may be formed of two physically different networks or may be overlaid to form one physical network. In the case of the two physical networks, controller 406 could be connected to the control network while VOA 402 and optical amplifier 404 could be connected to the data network. In the case of an overlaid network, both the controller 406, the VOA 402 and the amplifier 404 could be connected to the one physical network, wherein the controller 406 would be able to detect any low bandwidth control information and the VOA 402 could receive any high bandwidth data. Thus, the invention could be embodied to operate in optical networks having a variety of configurations.

Figure 5:
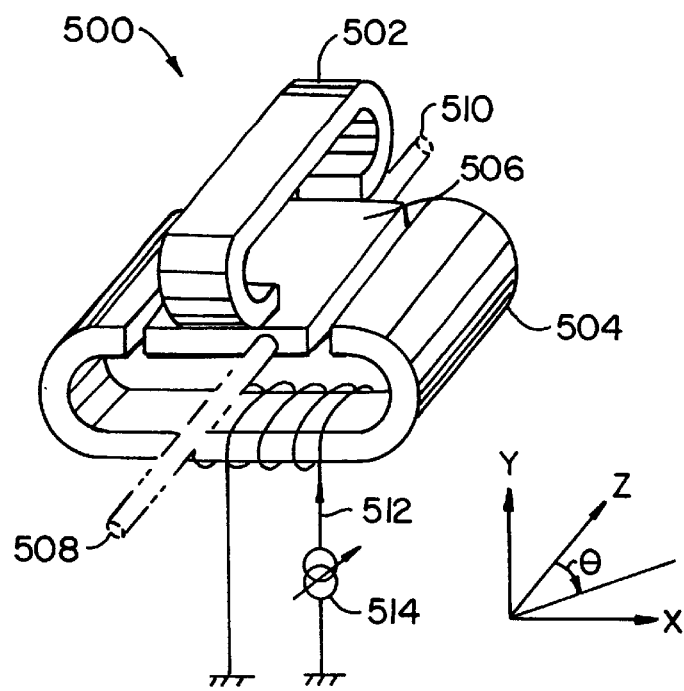
FIG. 5 illustrates an embodiment of a variable optical attenuator.

FIG. 5 shows an attenuator 500 that may be used in one embodiment of the VOA 402. Attenuator 500 comprises a permanent magnet 502, an electromagnet 504, a current source 514 and a magneto-optic crystal 506. Also depicted in FIG. 5 is an input light beam 508 and an output light beam 510. Attenuator 500 is implemented as a Faraday effect variable optical attenuator consisting of two polarizers and a Faraday rotator. The Faraday effect rotator can control an angle of rotation of the polarization and thereby control the attenuation of the input light beam. During operation of the attenuator 500, an angle $\theta$ is defined which is the angle between the direction of magnetization and light propagation. As the angle $\theta$ increases, the attenuation of the optical signal also increases. The value of $\theta$ can be changed by controlling a drive current 512 at current source 514 and thereby creating a series of optical attenuation factors that correspond to selected drive current values.

Figure 6:
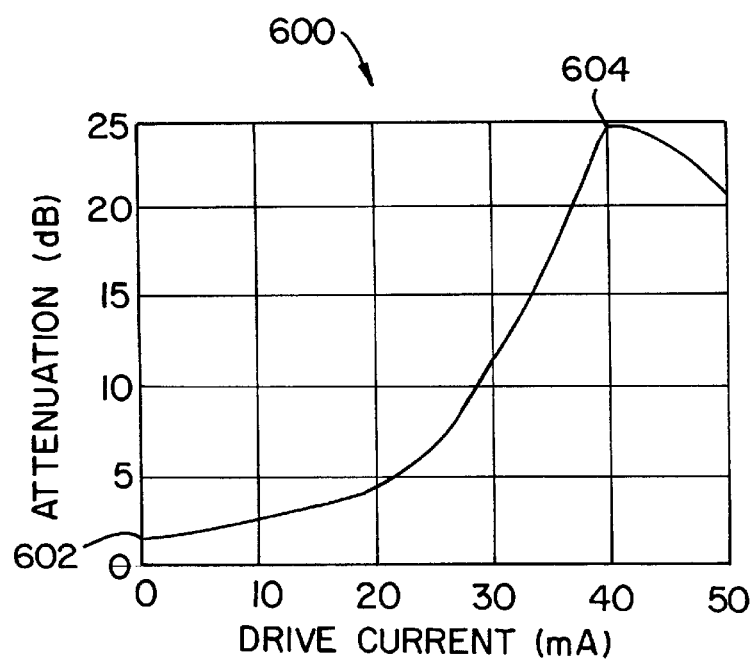
FIG. 6 illustrates a graph of attenuation versus drive current for the attenuator of FIG. 5.

FIG. 6 shows a graph 600 that depicts the attenuation achieved by attenuator 500 as a function of the drive current 512 applied. At point 602, a minimum attenuation of about 1.8 dB occurs with the drive current at 0.0 mA. At point 604, a maximum attenuation of about 25 dB occurs with the drive current at about 40 mA. Although a Faraday effect optical attenuation module has been discussed, it will be apparent to those skilled in the art that other optical attenuation modules may be used without deviating from the scope of the invention.

Figure 7:
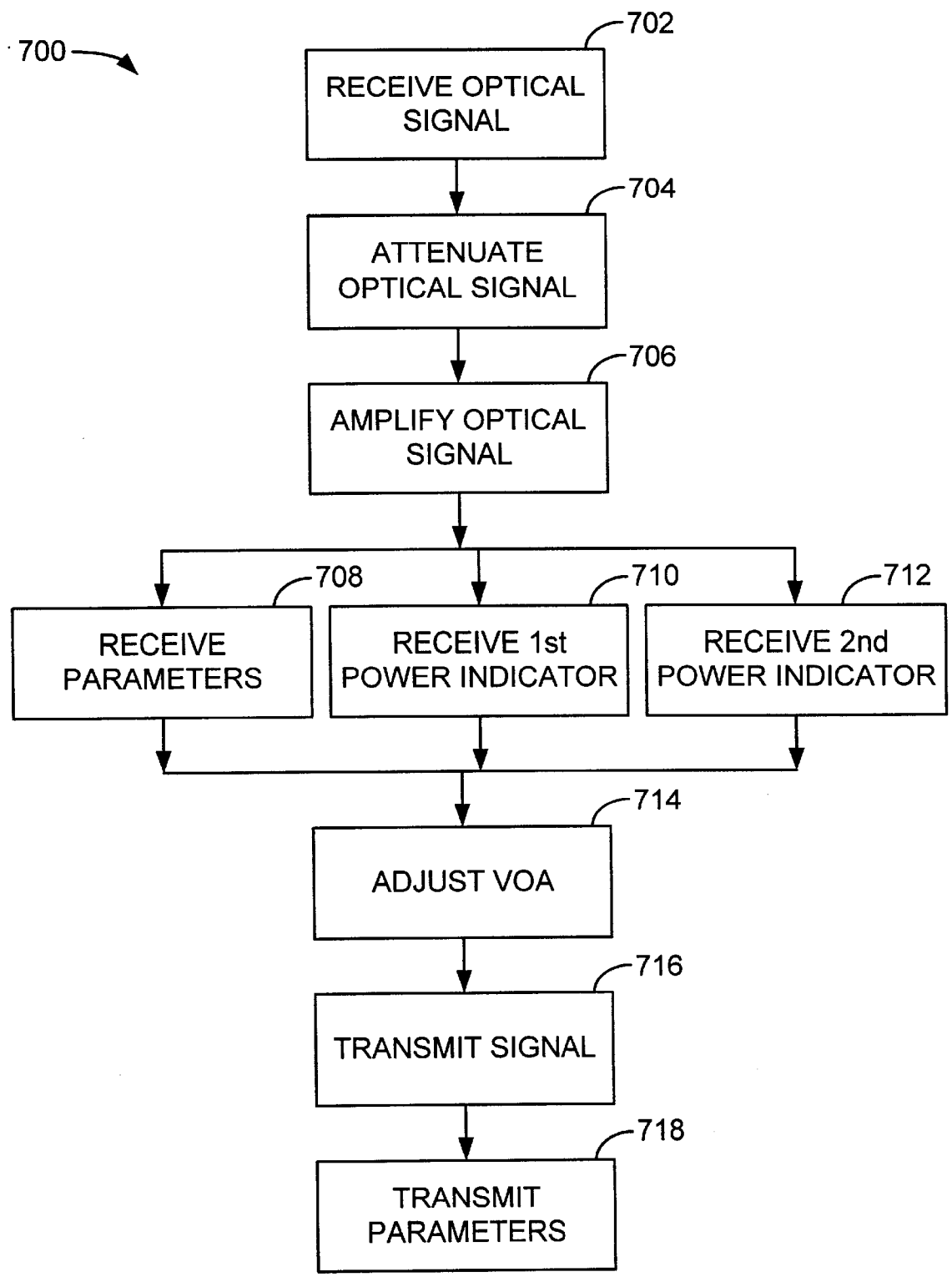
FIG. 7 illustrates an operating method of the embodiment of FIG. 4.

FIG. 7 shows a flow diagram 700 depicting several methods of operating the optical amplifying module 400 of FIG. 4.

At step 702, an optical input signal is received from the optical network. The optical input may comprise one or more subcarrier channels wherein each channel is located within the available frequency spectrum. The input signal is received from the optical network at the optical input 408. At step 704, the optical input is attenuated by the VOA 402 to form an attenuated optical signal 424. At step 706, the attenuated optical signal 424 is amplified by the optical amplifier 404 to form an amplified optical signal 410. At steps 708, 710 and 712, three methods for determining an adjustment to the attenuation factor of the VOA are provided.

In a first method, as shown at step 708, one or more parameters are received from the network at the parameter input port 412. The controller 406 uses these parameters to determine the adjustment to the attenuation factor of the VOA 402. The system parameters may include, but are not limited to, network switching event information, signal channel configuration, a specific attenuation for the VOA, the number of wavelengths present in the fiber, the target input power to the optical amplifier for ideal operation, or other network operating characteristics. For example, if a network switching event occurs, increases or decreases in the levels of signals received by the amplifying module 400 may also occur. The controller 406 receives information about the switching event from the parameter input line 412. Based on this information, controller 406 may set the attenuation factor control line 420 to increase or decrease the amount of attenuation, so that the changed signal levels can be quickly accommodated by the amplifier module 400.

In a second method, as shown at step 710, the controller 406 determines the attenuation factor from the input monitor indicator 416 of the attenuated signal 424. If the input monitor indicator 416 shows the signal level to be too high, the controller can increase an attenuation factor of the VOA 402 to reduce the signal level. Alternatively, the controller 406 can reduce the attenuation factor if the input monitor indicator 416 shows the signal level is too low.

In a third method, as shown at step 712, the controller determines the attenuation factor from the output monitor indicator 418 of the amplified signal 410. If the output monitor indicator 418 shows the signal level to be too high, the controller can increase an attenuation factor of the VOA 402 to reduce the signal level. Alternatively, the controller 406 can reduce the attenuation factor if the output monitor indicator 418 shows the signal level is too low.

In a fourth method, the controller determines the attenuation factor from a combination of two or more of the methods described above. For example, if a switching event occurred that resulted in a change in per channel power input to the optical amplifying module 400, the controller 406 could determine the setting on the VOA 402 from the measured attenuated signal 416 and network information received at input 412 containing the number of wavelengths present in the fiber and an acknowledgment that there has been a change in the power per channel in the input signal received at input 408. The result is a constant output power per channel in the output signal 410.

In another example of the fourth method, if the number of channels in the input signal 408 changed but the per channel power did not, an adjustment of VOA 402 may not be necessary if the amplifier 404 is gain locked. In this case, the optical amplifier 404, through loop controller 202, will adjust to provide a constant gain. The overall result is no change in output power per channel in the output signal 410, only change in the number of channels in the input signal 410.

Therefore, the controller 406 can maintain constant input levels per channel to the optical amplifier 404, and due to the fixed gain of the optical amplifier, produce output signals at output 410 having constant per channel power levels. As a further verification, controller 406 can monitor output indicator 418 to verify that desired signal levels are being produced at the output 410.

At step 714, the controller has determined what the attenuation factor should be and uses the attenuation factor control line 420 to set the attenuation factor of the VOA 402.

At step 716, the output signal 410, which results from the attenuation and gain of the input signal 408, is transmitted onto the optical network. As a result, optical amplifier 404 will continue to produce an optical signal output 410 which has constant gain flatness and optical output power even though a switching event may have changed the input signal levels to the amplifier module 400.

At step 718, the controller 406 may transmit parameters regarding the operation of the amplifying module 400 over the network. Such parameters may include a temperature alarm, lost signal indicator, amplifier bad indicator, amplifier disabled indicator, amplifier muted indicator and others indicators relative to amplifier operation.

Amplification produced by optical amplifier 400 does not always result in the output signal power being greater than the input signal power. For example, if the attenuation factor of the VOA 402 is greater than the amplification factor of the optical amplifier 404, then the output signal power could be lower than the input signal power. This may be desirable where the input signal power has become very large due to, for example, a network switching event as described above.

The following descriptions describe performance of several embodiments of the invention under various network operating conditions. Throughout the discussion, signal amplitude levels are given as relative values since the embodiments are not dependent upon specific values for proper operation. It should be apparent to those skilled in the art that modification to the embodiments may occur without deviating from the scope of the invention.

FIG. 8 shows amplifying module 800 constructed according to the teachings of the present invention. Amplifying module 800 can be operated in an optical network and is adaptable to network switching events. Amplifying module 800 comprises VOA 802, optical amplifier 804, controller 806, input monitor 808 and output monitor 810. The VOA 802 has an optical input 812 and the optical amplifier 804 has an optical output 814. The controller 806 provides an attenuation control line 816 to control the attenuation setting of the VOA 802. The controller 806 also has a bi-directional port 818 for sending and receiving information parameters with network 820.

FIG. 9 shows a plot of amplitude versus frequency of a representative optical signal 902 that may occur at the optical input 812. The optical signal 902 has channels 1–4 which represent 4 subcarriers containing information to be transmitted over the optical network. The channels 1–4 would typically occupy any of the frequencies in the available frequency spectrum of 1500 nm to 1560 nm. Each of the four channels has an amplitude 904 as shown in FIG. 9.

An attenuated signal 906 results after the attenuation of the optical signal 902 by VOA 802. The attenuated signal 906 appears at the output 803 of the VOA 802. The channels 1–4 are present in the attenuated signal and are located at the same frequency locations as in the optical signal 902. After attenuation, the channels 1–4 each have an amplitude 908. Thus, the amount of attenuation provided by the VOA 802 is shown as attenuation factor 910.

An amplified signal 912 appears at output 814 as a result of the attenuated signal 906 being amplified by amplifier 804. Channels 1–4 remain in the same frequency locations respectively, but have been amplified so that each channel now has an amplitude level 914. In this embodiment, the amount of amplification provided by amplifier 804 is shown as amplification factor 916. Thus far it has been shown how the input signal 902 is attenuated by the VOA 802 to produce the attenuated signal 906, which is then amplified by the optical amplifier 804 to produce the amplified signal 912 for transmission on the optical network. As will be shown, by adjusting the level of attenuated signals at the attenuator output 803, output signals from amplifier 800 will maintain constant amplitude levels.

Figure 10:
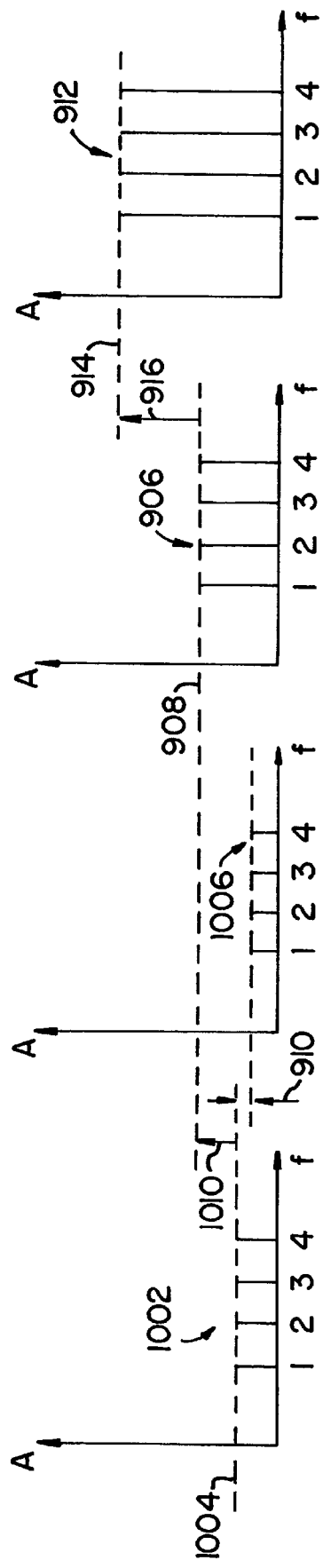
FIG. 10 illustrates waveforms associated with the embodiment of FIG. 8.

FIG. 10 shows a representative optical signal 1002 received at input 812 as a result of a switching event in the network. The optical signal 1002 is identical in frequency content to optical signal 902, however, the network switching event caused additional signal attenuation to the optical signal 1002 during transmission to the amplifier 800. The optical signal 1002 has channels 1–4 each having an amplitude of 1004 as shown. Due to the additional attenuation, the amplitude level 1004 is lower than the amplitude level 904. Since the attenuation factor of the VOA 802 is set to attenuate signals with level 904, when the optical signal 1002 is attenuated, an attenuated signal 1006 is produced. The attenuated signal 1006 has a lower level than the desired level represented by level 908, since it has been attenuated by attenuation factor 910. To avoid this over attenuated situation, the controller 806 reduces the attenuation factor of the VOA 802 via control line 816 thereby producing less attenuation. The reduced attenuation results in an attenuated signal 906 that has a level of 908 as desired. The attenuation factor to produce signal 906 is shown at 1010. As can be seen, the reduced attenuation effectively becomes a gain increase. This demonstrates how setting the initial attenuation value of the VOA 802 to a mid-range value provides a mechanism to achieve a gain increase to compensate for input signals that have experienced additional losses due to network switching events. The attenuated signal 906 is then amplified by amplification factor 916 to form amplified signal 912 having amplitude level 914.

In another embodiment of the invention, it is possible to compensate for changes in the network configuration. In WDM networks, situations may occur where the number of channels contained in an optical signal changes. When this occurs, amplifiers in the signal path may distort the channel levels as one or more channels are added to or subtracted from the original signal. In the following embodiment, it is possible to compensate for such network reconfigurations.

Figure 11:
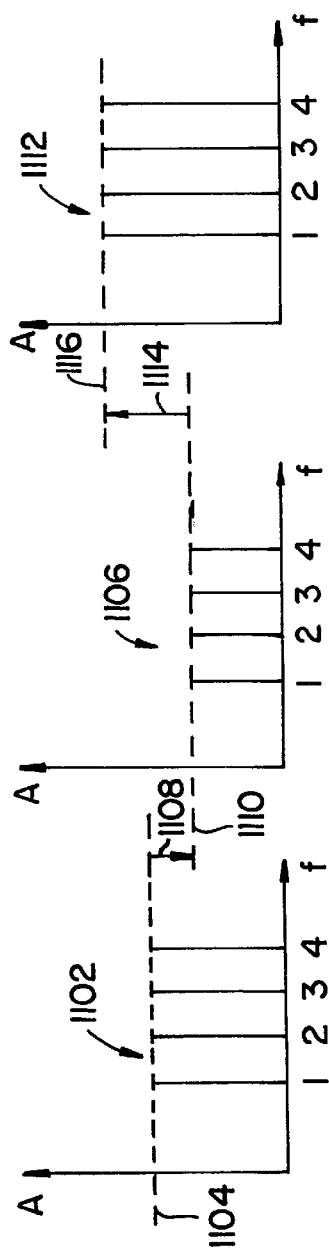
FIG. 11 illustrates waveforms associated with the embodiment of FIG. 8.

FIG. 11 shows an optical signal 1102 received at optical input 812. The optical signal 1102 comprises channels 1–4 each having amplitude level 1104. An attenuated signal 1106 is produced when the optical signal 1102 is attenuated by an attenuation factor 1108 resulting in the attenuated signal 1106 having level 1110. An amplified signal 1112 is produced when the attenuated signal 1106 is amplified by an amplification factor 1114 resulting in amplified signal 1112 wherein each of the channels 1–4 have amplitude level 1116.

Figure 12:
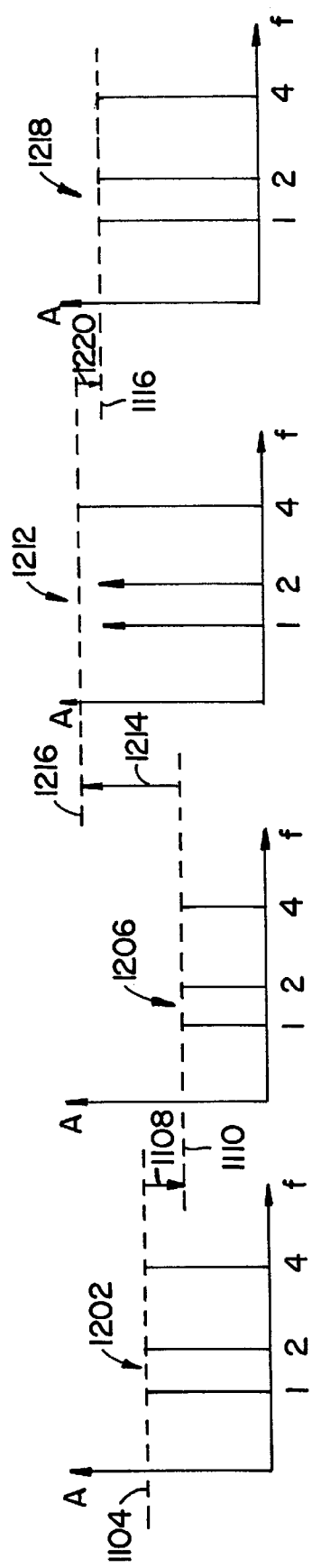
FIG. 12 illustrates waveforms associated with the embodiment of FIG. 8.

FIG. 12 shows what happens when a network reconfiguration occurs wherein the number of channels in the optical signal 1102 is decreased. An optical signal 1202 comprising channels 1, 2 and 4 each having level 1104, is received at the optical input 812. Due to a network reconfiguration, channel 3 has been removed from the optical signal 1102 so that the input to amplifier 800 is now shown by the optical signal 1202.

An attenuated signal 1206 results when the optical signal 1202 undergoes an attenuation factor 1108. The attenuated signal 1206 contains channels 1, 2 and 4 each having amplitude level 1110 as shown. However, due to the loss of channel 3, the overall signal power of the attenuated signal 1206 is less than the signal power of the corresponding attenuated signal 1106. The controller 806 detects the reduction in signal power of the attenuated signal 1206 by using the input monitor 808. The controller 806 has the capability to decrease the attenuation factor of the VOA 802 utilizing the control line 816 to compensate for the loss of channel 3 in optical signal 1202. However, in this embodiment, the controller 806 receives information parameters about the network reconfiguration from the network 820 via the parameter input 818. When the controller 806 determines that the reduction in signal power is due to the loss of channel 3, the controller 806 does not adjust the attenuation factor. This results in the attenuated signal 1206 being input to the amplifier 804 having a lower total power level than the attenuated signal 1106.

An amplified signal 1212 results when the attenuated signal 1206 is amplified by amplifier 804. Because the overall signal power of the attenuated signal 1206 is less than that of corresponding attenuated signal 1106, the gain from amplifier 804 shown at 1214 is slightly different than the corresponding gain as shown at 1114. This can result in gain tilt within the erbium fiber optical amplifier 804 which can be seen from the different levels of channels 1, 2 and 4 in the amplified signal 1212. As previously described, the dynamic gain tilt of an erbium fiber amplifier causes gain changes across the wavelength range as the input signal power changes. The amplified signal 1212 has an amplitude level of 1216 for channel 4 as shown. However, there can be gain distortion to the channels 1 and 2 since they do not receive the same gain as channel 4. To compensate for this distortion, the internal loop controller 202 of the optical amplifier 804 adjusts the pump laser 208 so that the ratio of output power to input power of the optical amplifier 804 stays constant.

An adjusted amplified output signal 1218 is produced after the loop controller 202 has adjusted the pump laser 208 via the pump current 210. The adjustment in pump current results in a readjustment of the channel gain as shown at 1220. This reduces the level of the adjusted amplified output signal 1218 to the level 1116 as desired. Also the effects of gain tilt are corrected since channels 1, 2 and 4 now have the same levels. Thus, by using the network parameters, the controller determined that optimum performance would be achieved by allowing the erbium amplifier optical amplifier 804 to adjust the pump laser to compensate for the variation in signal power due to the channel reconfigurations. As a result, the remaining channels 1, 2 and 4 in the adjusted amplified output signal 1218 receive the correct amplification.

In another embodiment of the invention, it is possible to compensate for optical signals which are multiplexed in the network. In WDM networks, situations may occur where two or more optical signals, each containing a number of channels, are multiplexed to form one optical signal containing all the channels. The multiplexed signal is then amplified for transmission in the optical network. In the following embodiment, it is possible to multiplex and amplify such signals while compensating for variations in signal levels.

Figure 13:
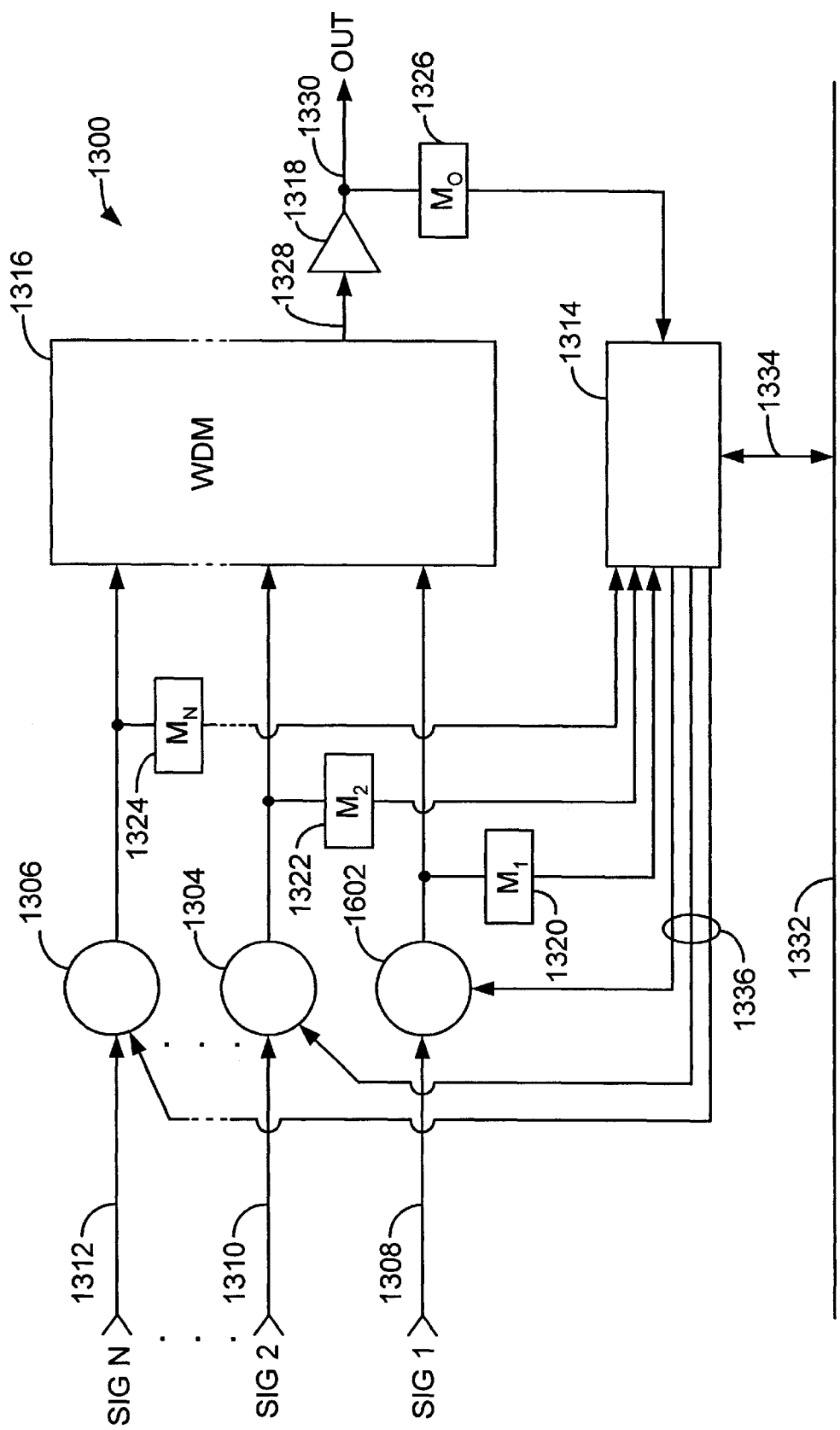
FIG. 13 illustrates another embodiment of the present invention.

FIG. 13 shows an embodiment 1300 of the invention for multiplexing a number (N) of input signals in a WDM optical network. Embodiment 1300 comprises N VOAs for receiving N input signals. For clarity, only first VOA 1302, second VOA 1304 and $N^{th}$ VOA 1306 are shown in FIG. 13. The first VOA 1302 receives a first input signal (Sig1) via input port 1308. The second VOA 1304 receives a second input signal (Sig2) via input port 1310. The $N^{th}$ VOA receive an $N^{th}$ input signal (SigN) via input port 1312.

The embodiment 1300 also comprises controller 1314, WDM multiplexer 1316 and optical amplifier 1318. The controller 1314 may monitor the signals output from the VOAs via signal monitors 1320, 1322 and 1324, respectively. The controller may also set the attenuation factor for each of the VOAs, via use of N attenuation control lines 1336. The WDM multiplexer 1316 receives all the attenuated signals from the VOAs, multiplexes them together to form a multiplexed signal 1328 which is provided to the optical amplifier 1318. The optical amplifier 1318 amplifies the multiplexed signal 1328 to form amplified signal 1330 for transmission on the optical network. The controller may also monitor the signal level of the amplified signal 1330 via output monitor 1326. Optical network 1332 and the controller 1314 may exchange information parameters via parameter port 1334.

Figure 14:
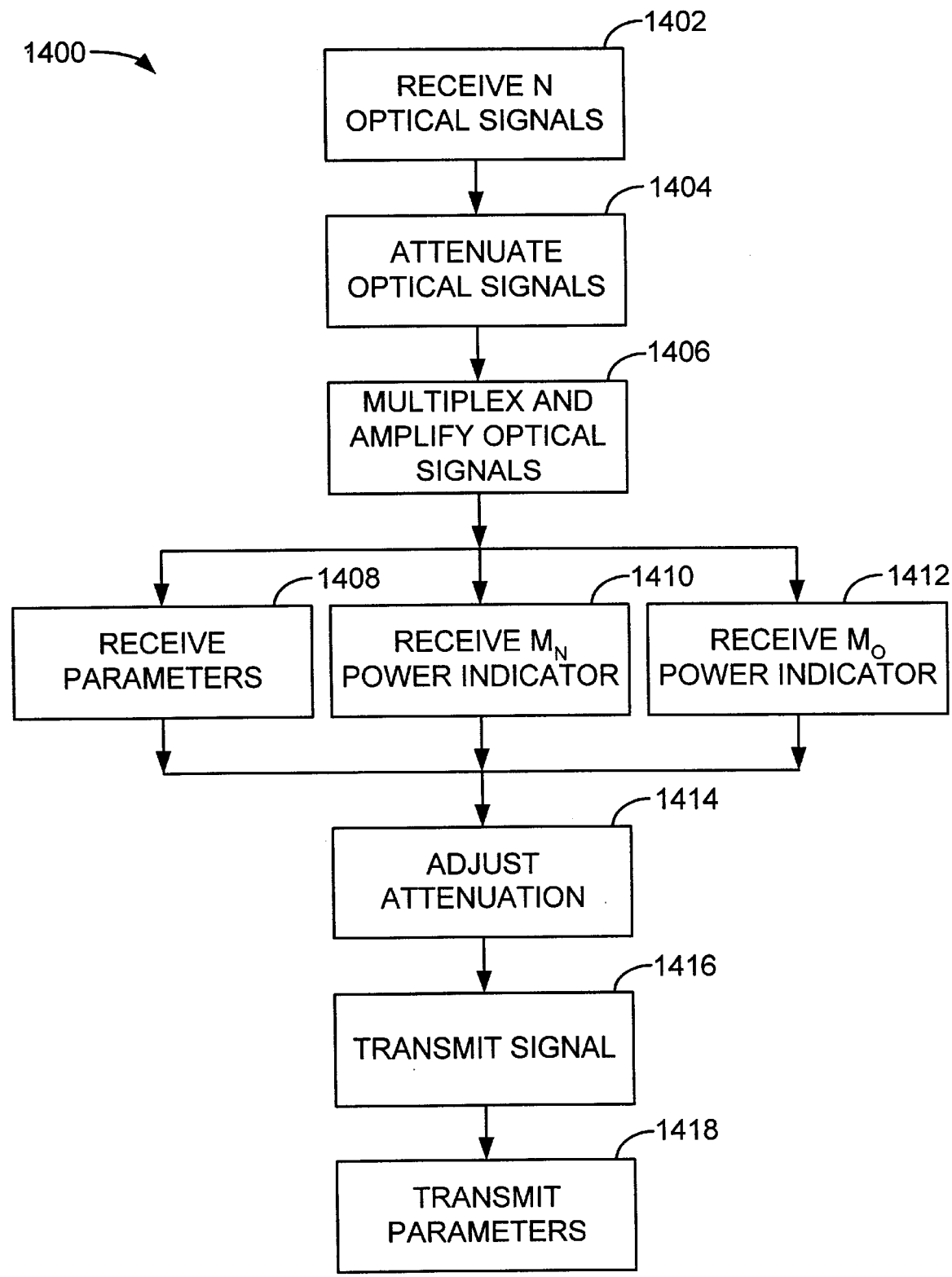
FIG. 14 illustrates an operating method of the embodiment of FIG. 13.

FIG. 14 shows a flow diagram 1400 depicting several methods of operating the embodiment 1300 of FIG. 13. At step 1402 the optical input signals Sig1, Sig2 and all other input signals up to SigN, are received at the respective VOAs 1302, 1304 and up to 1306. Each optical input signal may comprise one or more subcarrier channels. At step 1404 the optical input signals are attenuated to form attenuated signals for input to the WDM multiplexer 1316. At step 1406 the attenuated signals are multiplexed together to form the multiplexed signal 1328 which is amplified by the optical amplifier 1318 to form the amplified optical signal 1330. At steps 1408, 1410 and 1412 the controller 1314 may use one of several methods to determine the attenuation factors of the VOAs.

In one method, illustrated at step 1408, the controller 1314 receives one or more parameters from the optical network 1332 via the parameter port 1334 and determines the attenuation factors of the VOAs based on the received parameters.

In another method, illustrated at step 1410, the controller monitors the signal levels of the attenuated signals using the monitors 1320, 1322 and up to 1324. Based on the monitored signal levels, the controller may determine the attenuation factors of one or more of the VOAs. In another method, illustrated at step 1412, the controller may monitor the output signal level via monitor 1326 and determine the attenuation factors of one or more of the VOAs based on this level. In another method, the controller 1314 may use a combination of the above methods to determine the settings for the VOAs.

At step 1414, the attenuation factor settings for the VOAs are set by the controller 1314 via the attenuation factor control lines 1336. At step 1416, the amplified optical signal which reflects the attenuation factor settings is transmitted onto the optical network. At step 1418, the controller may transmit operating parameters regarding the operation of the amplifying module over the network via the parameter port 1334.

Figure 15:
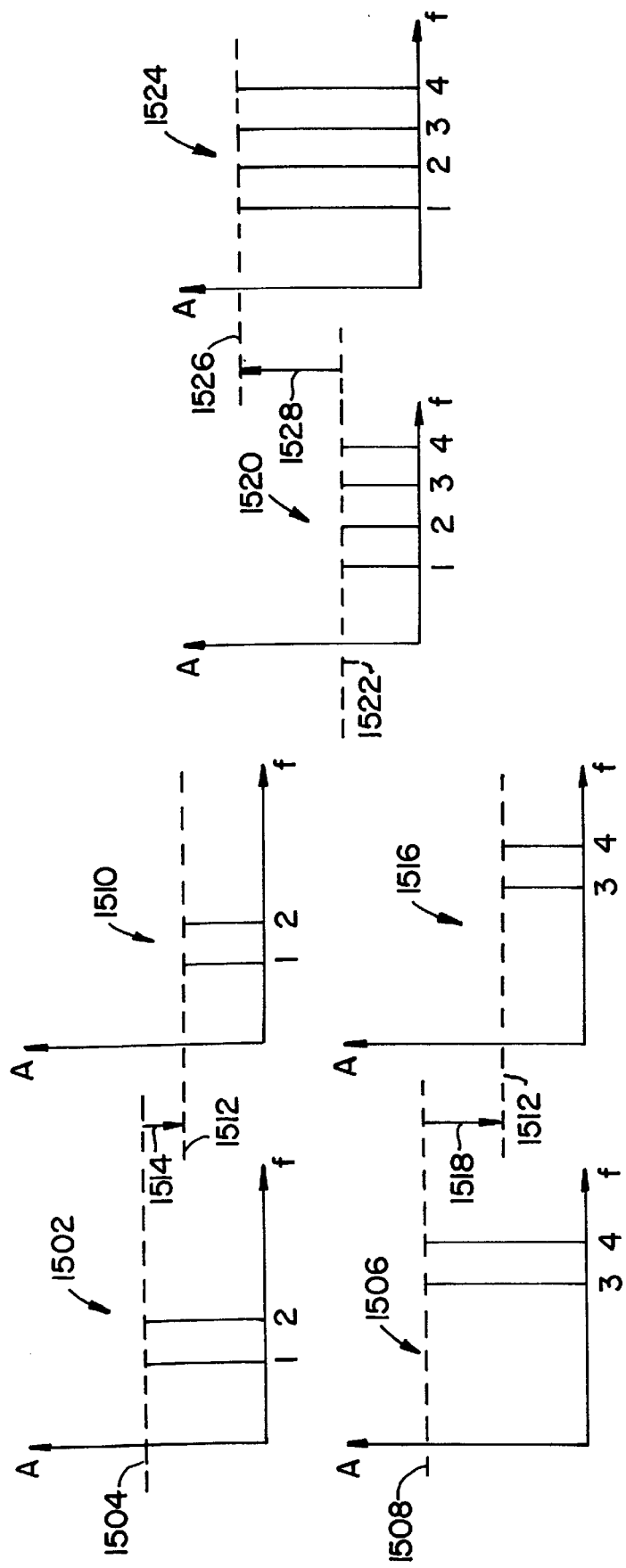
FIG. 15 illustrates waveforms associated with the embodiment of FIG. 13.

FIG. 15 shows waveforms depicting the operation of the embodiment 1300. Although the embodiment 1300 may have up to N input signal, for clarity and convenience only two input signals will be used to explain the operation of the embodiment. It will be apparent to one skilled in the art that more than two input signals can be processed by the embodiment 1300, given that N VOAs are possible, and that processing would occur in a similar fashion to the case of only two input signals.

A first optical input signal 1502 is shown having channels 1 and 2 with each channel having an amplitude level of 1504. The optical input signal 1502 is input at the input port 1308 of the first VOA 1302. A second optical signal 1506 is shown having channels 3 and 4 with each channel having amplitude level of 1508. The optical signal 1506 is input at input port 1310 of the second VOA 1304.

A first attenuated signal 1510 results when the optical signal 1502 is attenuated by VOA 1302 under control of the controller 1314. The first attenuated signal 1510 has an amplitude level 1512 which represents an attenuated amount 1514 as shown. A second attenuated signal 1516 is the result of the optical input signal 1506 being attenuated by the VOA 1304 under control of the controller 1314. The second attenuated signal 1516 has an amplitude level 1512 which represents an attenuated amount 1518 as shown.

In the operation of the embodiment 1300, the controller 1314 adjusts the attenuation factor of the VOA's 1302 and 1304, respectively, so that the attenuated optical signals 1510 and 1516 have the same amplitude level 1512 after attenuation even though the attenuated amounts as shown at 1514 and 1518 may be different. The controller selects the attenuation settings based on one or more of the methods described above and illustrated in FIG. 14.

A multiplexed signal 1520 results when the attenuated signals 1510 and 1516 are input to the WDM 1316 and multiplexed therein. The channels 1–4 are combined in the multiplexer output 1328 represented by the multiplexed signal 1520 so that each of the channels 1–4 has an amplitude level 1522 as shown. An amplified output signal 1524 results when the amplifier 1318 amplifies the multiplexer output 1328 so that the channels 1–4 have amplitude level 1526 as shown. The amplification factor is shown at 1528. Thus, embodiment 1300 can receive two or more optical input signals having associated channels of different amplitudes, independently attenuate the signals, multiplex the attenuated signals and amplify the result to produce an output signal for transmission on the network. Additionally, the controller 1314 may utilize one or more of the methods described by steps 1408, 1410 or 1412 to determine adjustments to the VOAs 1302 and 1304 as necessary.

In another embodiment of the invention, it is possible to compensate for optical signals which are to be multiplexed and transmitted over a path on the optical network which has low loss. In this case, amplification of the signals may not be necessary. In the following embodiment, it is possible to multiplex signals while compensating for variations in signal levels without the need for amplification.

Figure 16:
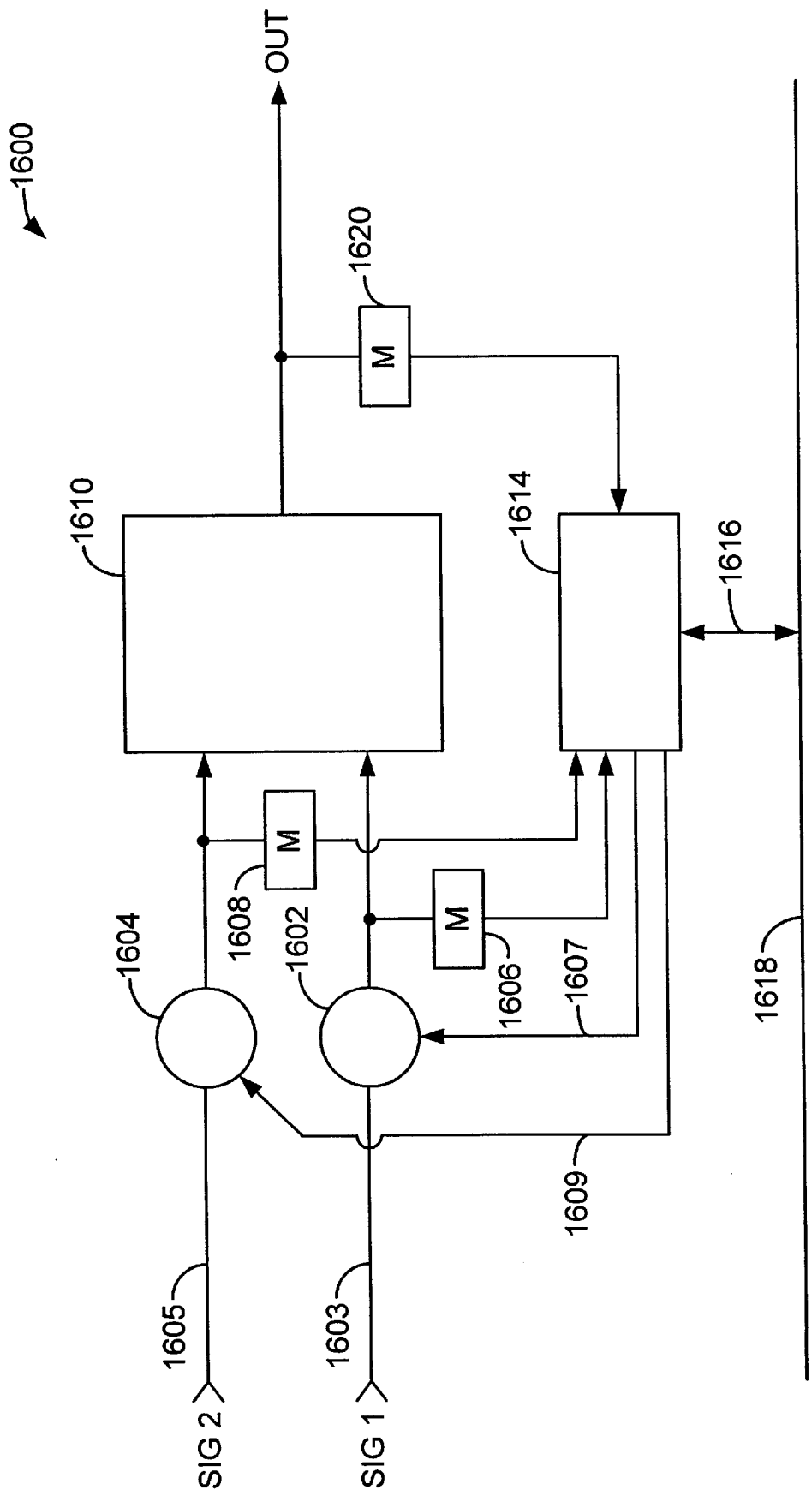
FIG. 16 illustrates another embodiment of the present invention.

FIG. 16 shows an embodiment 1600 of the invention for multiplexing optical signals in a WDM optical network. Although the embodiment 1600 may be used to process a varied number of input signals, in a manner similar to the embodiment 1300, only two input signals will be described for clarity. The embodiment 1600 comprises first VOA 1602, second VOA 1604, first input monitor 1606, second input monitor 1608, WDM multiplexer 1610, output monitor 1612 and controller 1614. The first VOA 1602 has optical input 1603 and attenuation control line 1607. The second VOA 1604 has optical input 1605 and attenuation control line 1609. Controller 1614 has parameter port 1616 for communicating with network 1618.

Figure 17:
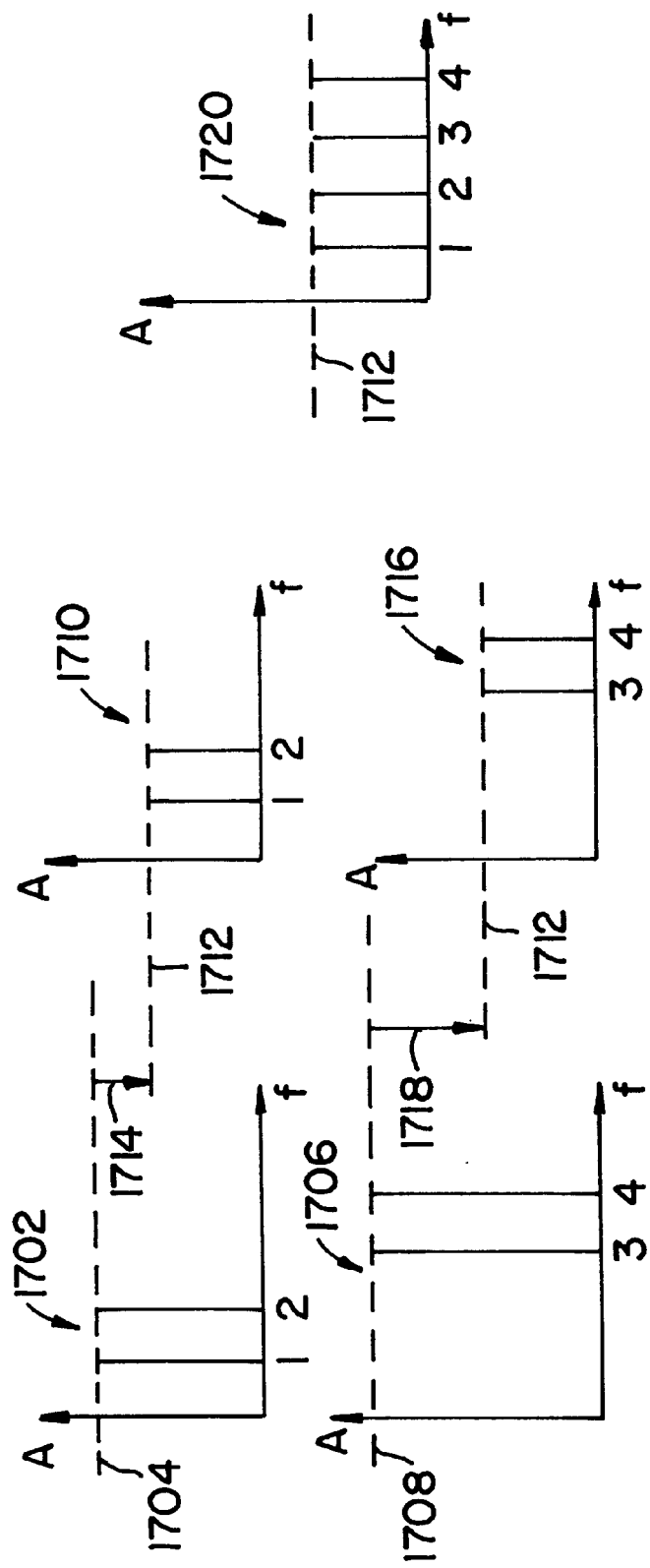
FIG. 17 illustrates waveforms associated with the embodiment of FIG. 16.

FIG. 17 illustrates waveforms depicting the operation of the embodiment 1600. A first optical input signal 1702 is shown having channels 1 and 2 with each channel having an amplitude level of 1704. The optical signal 1702 is input at input port 1603 of VOA 1602. A second optical signal 1706 is shown having channels 3 and 4 with each channel having an amplitude level of 1708. The optical signal 1706 is input at input port 1605 of VOA 1604.

A first attenuated signal 1710 results when the optical signal 1702 is attenuated by the VOA 1602 under control of the controller 1614. The first attenuated signal 1710 has amplitude level 1712 after having been attenuated by an attenuated amount 1714 as shown. A second attenuated signal 1716 is the result of the optical signal 1706 being attenuated by the VOA 1604 under control of the controller 1614. The second attenuated signal 1716 has amplitude level 1712 after having been attenuated by an attenuated amount 1718 as shown.

A multiplexed signal 1720 results when the attenuated signals 1710 and 1716 are multiplexed by the WDM multiplexer 1610. The channels 1–4 are combined in the multiplexed signal 1720 so that each channel has an amplitude level 1712 as shown. Since a low loss path is anticipated, the level 1712 is of sufficient level that the need for further amplification is unnecessary.

The controller 1614 adjusts the VOA's 1602 and 1604 so that the optical signals 1710 and 1716 have the same amplitude even though the attenuated amounts as shown at 1714 and 1718 may be different. Additionally, the controller 1412 may monitor the multiplexed output signal via the output monitor 1620 and perform adjustments to the VOAs 1602 and 1604 as necessary. Thus, the embodiment 1600 of the invention allows the multiplexing of signals in a WDM network without additional amplification for transmission over short transmission paths.

Under certain network operating conditions it may become necessary to amplify signals having channels with various amplitudes. In one case, a first signal may have two or more channels with different amplitudes and is to be multiplexed and amplified with a second signal having channels with other amplitudes. Referring again to the embodiment 1300, a description of how such signals may be multiplexed and amplified will be given with additional reference to the waveforms of FIG. 18. For clarity and convenience, only two input signals will be considered.

Figure 18:
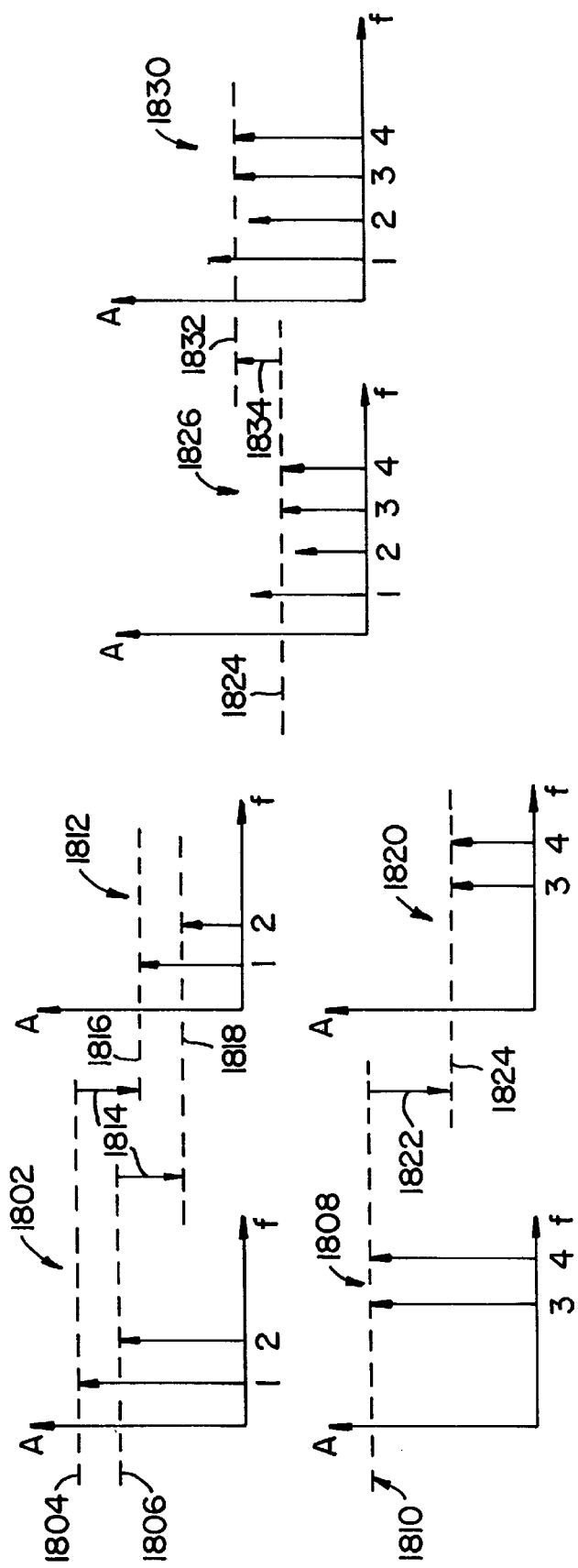
FIG. 18 illustrates waveforms associated with the embodiment of FIG. 13.

FIG. 18 shows waveforms depicting the operation of the embodiment 1300, wherein the input signals have channels of various amplitudes. A first optical signal 1802 is shown having channels 1 and 2 with channel 1 having amplitude 1804 and channel 2 having amplitude 1806. The optical signal 1802 is input at input port 1308 of the VOA 1302. A second optical signal 1808 is shown having channels 3 and 4 with each channel having an amplitude of 1810. The optical signal 1808 is input at input port 1310 of the VOA 1304.

A first attenuated signal 1812 results when the optical signal 1802 is attenuated by the VOA 1302, under control of the controller 1314. The attenuation value is shown at 1814. The attenuated signal 1812 results in channels 1 and 2 having amplitude levels of 1816 and 1818 respectively. A second attenuated signal 1820 results when the optical signal 1808 is attenuated by the VOA 1304, under control of the controller 1314. The attenuation value is shown at 1822. The attenuated signal 1820 results in channels 3 and 4 having amplitude level 1824 as shown.

A multiplexed signal 1826 results when the attenuated signals 1812 and 1820 are multiplexed by the WDM 1316 to form the multiplexed output signal 1328. The channels 1–4 are combined in the multiplexed signal 1826 so that the four channels have an amplitude level approximately equal to 1824 as shown. In this example, the amplitude for channel 1 is slightly greater than the level 1824 and the amplitude for channel 2 is slightly less than the level 1824. Channels 3 and 4 have amplitude levels approximately equal to level 1824. The controller 1314 can determine the level of the multiplexed signal 1826 based on an average value for the channels 1–4 or a minimum value or a maximum value. The average values can be measured for a group of channels within a fiber from a monitor port. Information on the approximate differences in the individual channels may be passed down to the controller 1314 as network parameters from the network 1332.

An output signal 1830 results when the amplifier 1318 amplifies the multiplexed signal 1826 so that the channels 1–4 have an approximate amplitude level 1832 as shown. The amplification amount is shown at 1834.

The controller 1314 may control the output signal 1830 by adjusting the VOAs, 1302 and 1304, in a way similar to the adjustment procedure described in steps 1408, 1410 and 1412 of FIG. 14. For example, the controller 1314 receives parameters from the parameter input 1334, which may be used to adjust the VOAs 1302 and 1304. Also, the controller 1314 monitors the attenuated signals 1320, 1322 and the amplified output signal 1330 and may use this information to adjust the attenuation of the VOAs 1302 and 1304. Thus, by continually monitoring the network parameters and the attenuated and amplified signal levels, the controller 1314 can maintain an output signal having approximately constant gain.

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention which is set forth in the following claims.

What is claimed is:

1. A device for amplifying an optical signal in an optical network, said device comprising:

an optical attenuator coupled to the optical network, said optical attenuator receiving the optical signal and producing an attenuated optical signal, said optical attenuator having a plurality of attenuation factors;

an optical amplifier coupled to said optical attenuator and the optical network, said optical amplifier receiving said attenuated optical signal and producing an amplified optical signal for transmission on the optical network; and a controller coupled to said optical attenuator, said optical amplifier and the optical network, said controller outputting a control signal to said optical attenuator for selecting one of said plurality of attenuation factors, wherein said optical amplifier outputs an indicator to said controller and wherein said controller generates said control signal based on said indicator.

2. The device of claim 1 wherein said indicator comprises a power value for said attenuated optical signal.

3. The device of claim 1 wherein said indicator comprises a power value for said amplified optical signal.

4. The device of claim 1 wherein the optical network comprises at least one parameter and wherein said controller generates said control signal based on a combination of said at least one parameter, a power value for said attenuated optical signal and a power value for said amplified optical signal.

5. A method of amplifying an optical signal in an optical network comprising the steps of:

receiving the optical signal from the optical network attenuating the optical signal by an attenuation factor to form an attenuated optical signal;

amplifying said attenuated optical signal to form an amplified optical signal;

transmitting said amplified optical signal on the optical network;

determining an operating indicator from an amplifying means used during the step of amplifying; and adjusting said attenuation factor based on said operating indicator.

6. The method of claim 5 wherein the step of determining comprises the step of determining said operating indicator based on a power value of said attenuated optical signal.

7. The method of claim 5 wherein the step of determining comprises the step of determining said operating indicator based on a power value of said amplified optical signal.

8. The method of claim 5 wherein the optical network comprises at least one parameter and the step of determining comprises the step of determining an operating indicator based on a combination of said at least one parameter, a power value of said attenuated optical signal and a power value of said amplified optical signal.

9. A device for multiplexing and amplifying a first optical signal and a second optical signal in an optical network, said device comprising:
   a first optical attenuator coupled to the optical network for receiving the first optical signal and producing a first attenuated optical signal, said first optical attenuator having a plurality of first attenuation factors;
   a second optical attenuator coupled to the optical network receiving the second optical signal and producing a second attenuated optical signal, said second optical attenuator having a plurality of second attenuation factors;
   an optical multiplexer coupled to said first optical attenuator and said second optical attenuator, said optical multiplexer multiplexing said first attenuated signal with said second attenuated signal to form a multiplexed optical signal;
   an optical amplifier coupled to said optical multiplexer, said optical amplifier receiving said multiplexed optical signal and producing an amplified optical signal for transmission on the optical network; and
   a controller coupled to said first optical attenuator, said second optical attenuator, said optical multiplexer, said optical amplifier and the optical network, said controller outputting a first control signal to said first optical attenuator selecting one of said plurality of first attenuation factors, and said controller for outputting a second control signal to said second optical attenuator selecting one of said plurality of second attenuation factors, and wherein said optical amplifier outputs an indicator to said controller and wherein said controller generates said first and second control signals based on said indicator.

10. The device of claim 9 wherein said optical multiplexer outputs an indicator to said controller and said controller generates said first control signal and said second control signal based on said indicator.

11. The device of claim 10 wherein said indicator is a power value of said first attenuated signal.

12. The device of claim 10 wherein said indicator is a power value of said second attenuated signal.

13. The device of claim 10 wherein said indicator is a power value of said multiplexed optical signal.

14. The device of claim 9 wherein the optical network comprises at least one parameter and said indicator is based on a combination of said at least one parameter, a power value of said first attenuated optical signal, a power value of said second attenuated optical signal and a power value of said amplified optical signal.

15. A method for multiplexing and amplifying a first optical signal and a second optical signal in an optical network comprising the steps of:
   receiving the first optical signal and the second optical signal;
   attenuating the first optical signal by a first attenuation factor to form a first attenuated optical signal;
   attenuating the second optical signal by a second attenuation factor to form a second attenuated optical signal;
   multiplexing said first attenuated optical signal and said second attenuated optical signal to form a multiplexed optical signal;
   amplifying said multiplexed optical signal to form an amplified optical signal;
   transmitting said amplified optical signal on the network;
   determining an operating indicator from an amplifying means used during the step of amplifying; and
   adjusting said first attenuation factor and said second attenuation factor based on said operating indicator.

16. The method of claim 15 wherein the step of determining comprises the step of determining said operating indicator based on a power value of said first attenuated signal.

17. The method of claim 15 wherein the step of determining comprises the step of determining said operating indicator based on a power value of said amplified optical signal.

18. The method of claim 15 wherein the optical network comprises at least one parameter and the step of determining comprises the step of determining said operating indicator based on a combination of said at least one parameter, a power value of said first attenuated signal, a power value of said second attenuated signal and a power value of said amplified signal.

19. An optical network for transmitting at least one optical signal, said optical network comprising:
   a plurality of nodes including at least a first and a second node;
   a plurality of interconnections coupled between said plurality of nodes including a first interconnection coupled between said first node and said second node, said first interconnection for transmitting the at least one optical signal between said first node and said second node; and
   an amplification module coupled to said first interconnection, the amplification module having logic to receive the at least one optical signal and at least one parameter and to amplify the at least one optical signal by an amplification factor to form an amplified optical signal for transmission on the optical network, the amplification factor based on the at least one optical signal and the at least one parameter, and wherein said amplification module comprises:
      an optical attenuator having logic to receive the at least one optical signal and to produce an attenuated optical signal, said optical attenuator having a plurality of attenuation factors;
      an optical amplifier coupled to said optical attenuator, said optical amplifier having logic to receive said attenuated optical signal and to produce said amplified optical signal; and
      a controller coupled to said optical attenuator and said optical amplifier, said controller having logic to output a control signal to said optical attenuator for selecting one of said plurality of attenuation factors, said control signal based on the at least one optical signal and said at least one parameter.

20. The amplification module of claim 19 wherein said optical amplifier outputs an indicator to said controller and wherein said controller generates said control signal based on said indicator.

21. The amplification module of claim 20 wherein said indicator comprises a power value for said attenuated optical signal.

22. The amplification module of claim 20 wherein said indicator comprises a power value for said amplified optical signal.

23. The amplification module of claim 20 wherein said indicator comprises a power value for said attenuated optical signal and a power value for said amplified optical signal and wherein said controller generates said control signal based on a combination of said at least one parameter and said indicator.

24. The amplification module of claim 23 wherein said amplification module is coupled to said first node.

25. The amplification module of claim 23 wherein said amplification module is coupled to said second node.

26. An optical network for transmitting at least a first optical signal and a second optical signal, said optical network comprising:

a plurality of nodes including at least a first and a second node;

a plurality of interconnections coupled between said plurality of nodes including at least a first interconnection coupled between said first node and said second node, said first interconnection transmitting the first optical signal and the second optical signal; and an amplification module coupled to said first interconnection, said amplification module having logic to receive the first optical signal, the second optical signal and at least one parameter, said amplification module having logic to amplify the first optical signal by a first amplification factor to form a first amplified signal, said amplification module having logic to amplify the second optical signal by a second amplification factor to form a second amplified signal, said amplification module having logic to multiplex said first amplified signal and said second amplified signal to form a third signal for transmission on the optical network, said first amplification factor and said second amplification factor based on the first optical signal, the second optical signal and said at least one parameter.

27. The optical network of claim 26 wherein said amplification module comprises:

a first optical attenuator having logic to receive the first optical signal and to produce a first attenuated optical signal, said first optical attenuator having a plurality of first attenuation factors;

a second optical attenuator having logic to receive the second optical signal and to produce a second attenuated optical signal, said second optical attenuator having a plurality of second attenuation factors;

an optical multiplexer coupled to said first optical attenuator and said second optical attenuator, said optical multiplexer having logic to multiplex said first attenuated optical signal and said second attenuated optical signal to produce a multiplexed signal;

an optical amplifier coupled to said optical multiplexer, said optical amplifier having logic to receive said multiplexed signal and to produce said amplified optical signal for transmission on the optical network; and a controller coupled to said first optical attenuator, said second optical attenuator and said optical amplifier, said controller having logic to output a first control signal to said first optical attenuator to select one of said plurality of first attenuation factors, said controller having logic to output a second control signal to said second optical attenuator to select one of said plurality of second attenuation factors, wherein said first control signal and said second control signal are based on the first optical signal, the second optical signal and said at least one parameter.

28. The amplification module of claim 27 wherein said first optical attenuator outputs an indicator to said controller and wherein said controller generates said first control signal and said second control signal based on said indicator.

29. The amplification module of claim 28 wherein said indicator comprises a power value for said first attenuated optical signal.

30. The amplification module of claim 27 wherein said second optical attenuator outputs an indicator to said controller and wherein said controller generates said second control signal based on said indicator.

31. The amplification module of claim 30 wherein said indicator comprises a power value for said second attenuated optical signal.

32. The amplification module of claim 27 wherein said controller generates said first control signal and said second control signal based on a combination of said at least one parameter, a power value for said first attenuated optical signal, a power value for said second attenuated optical signal and a power value for said amplified optical signal.

33. The amplification module of claim 32 wherein said amplification module is coupled to a second interconnection and the second optical signal is transmitted over said second interconnection.

34. The device of claim 33 wherein said amplification module is coupled to said first node.

35. The device of claim 33 wherein said amplification module is couple to said second node.

* * * * *